United States Patent [19]
Mejia et al.

[11] Patent Number: 6,094,064
[45] Date of Patent: Jul. 25, 2000

[54] PROGRAMMABLE LOGIC DEVICE INCORPORATING AND INPUT/OUTPUT OVERFLOW BUS

[75] Inventors: Manuel Mejia; David Jefferson, both of San Jose; Srinivas Reddy, Fremont, all of Calif.

[73] Assignee: Altera Corporation, San Jose, Calif.

[21] Appl. No.: 09/121,250

[22] Filed: Jul. 23, 1998

Related U.S. Application Data

[60] Provisional application No. 60/058,162, Sep. 8, 1997.

[51] Int. Cl.[7] ................................................ H03K 19/177
[52] U.S. Cl. ................................................ 326/39; 326/41
[58] Field of Search ........................................ 326/38–41

[56] References Cited

U.S. PATENT DOCUMENTS

| | | | |
|---|---|---|---|
| 5,546,018 | 8/1996 | New et al. | 326/38 |
| 5,670,897 | 9/1997 | Kean | 326/41 |
| 5,773,993 | 6/1998 | Trimberger | 326/38 |

OTHER PUBLICATIONS

Bursky, Dave, "Combination RAM/PLD Opens New Application Options", Electronic Design, pp. 138–140, May 23, 1991.

Intel Corporation "10 ns Flexlogic FPGA with SCRAM Option", Intel®,iFX780, pp. 2–24 –2–46, Nov. 1993.

NGAI, Tony Kai–Kit, "An SRAM–Programmable Field-–Reconfigurable Memory", Department of Electrical Engineering, University of Toronto, Thesis for Master of Applied Science, 1994.

*Primary Examiner*—Michael Tokar
*Assistant Examiner*—Don Phu Le
*Attorney, Agent, or Firm*—Beyer Weaver Thomas & Nguyen, LLP

[57] ABSTRACT

A programmable logic device architecture incorporating a peripheral overflow bus is disclosed. In a preferred embodiment, the programmable logic device has a core region that includes at least a plurality of logic cells interconnected by way of associated programmable logic cell conductors. The interconnected logic cells form an array suitable for use in implementing desired logic functions. The programmable logic device also has a peripheral region. The peripheral region includes at least a plurality of bi-directional ports of which selected ones may be coupled to external circuitry. The peripheral region also includes a bi-directional peripheral I/O overflow bus suitably arranged to pass a plurality of control signals and a plurality of data signals between the core region and the plurality of bi-directional ports.

22 Claims, 7 Drawing Sheets

PROGRAMMABLE LOGIC DEVICE INCORPORATING AND INPUT/OUTPUT OVERFLOW BUS

CROSS REFERENCE TO RELATED APPLICATION

This application claims benefit of priority under 35 U.S.C. 119(e) of U.S. Provisional Application No. 60/058162, filed Sep. 8, 1997, and entitled "I/O Overflow Bus for a PLD."

BACKGROUND OF THE INVENTION

1. Field of the Invention

The present invention generally relates to programmable logic devices. More specifically, the present invention relates to input/output (I/O) capabilities of programmable logic devices.

2. Description of the Related Art

A programmable logic device (PLD) is a programmable integrated circuit that allows the user of the circuit, using software control, to program particular logic functions the circuit will perform. Logic functions performed by small, medium, and large-scale integration integrated circuits can instead be performed by programmable logic devices. When an integrated circuit manufacturer supplies a typical programmable logic device, it is not yet capable of performing any specific function. The user, in conjunction with software supplied by the manufacturer or created by the user or an affiliated source, can program the PLD to perform particular function or functions required by the user's application. The PLD then can function in a larger system designed by the user just as though dedicated logic chips were employed. For the purpose of this description, it is to be understood that a programmable logic device refers to once programmable devices as well as reprogrammable devices.

Figure 1:
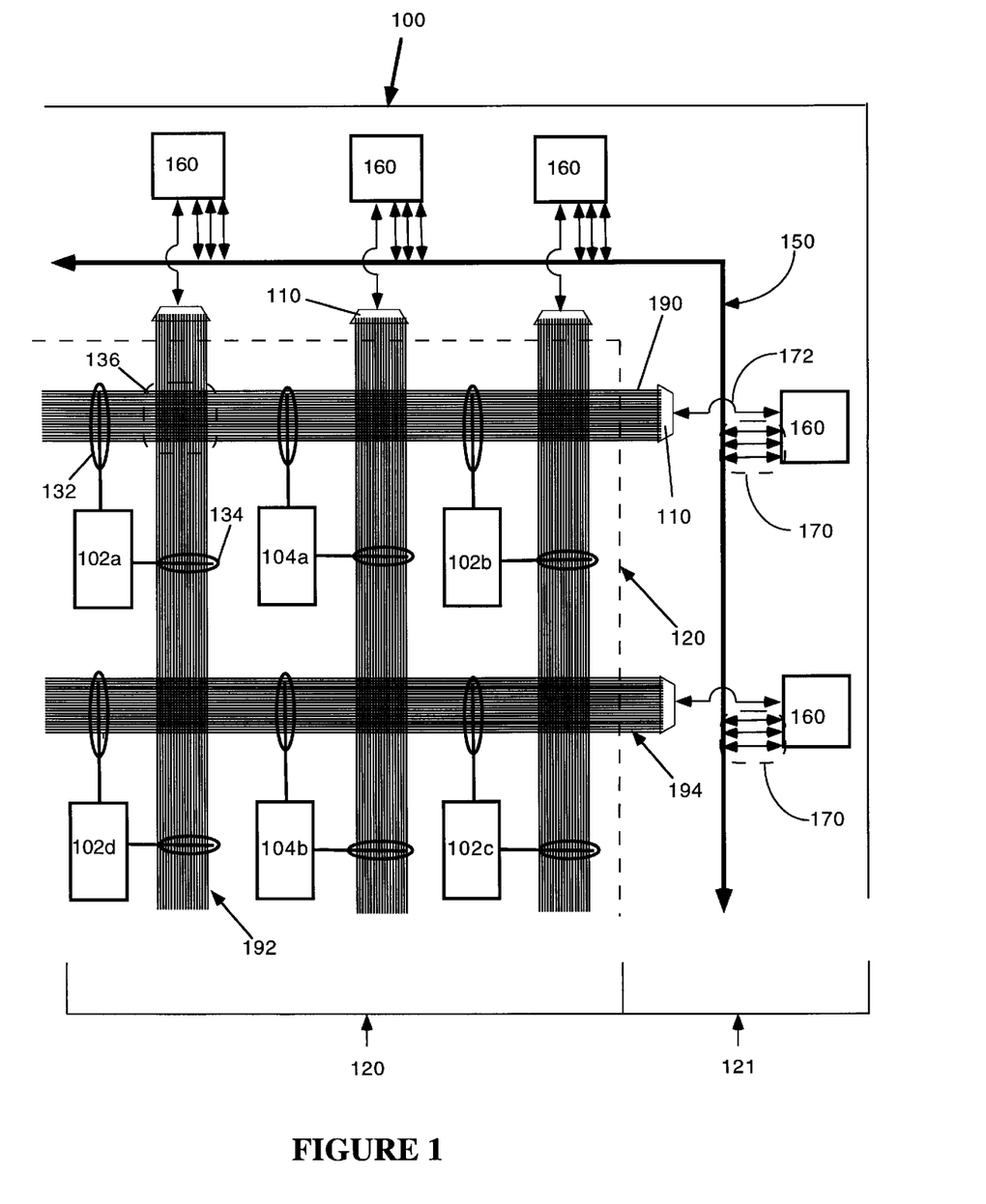
FIG. 1 is a block diagram of a conventional embedded array type complex programmable logic device architecture.
Figure 2:
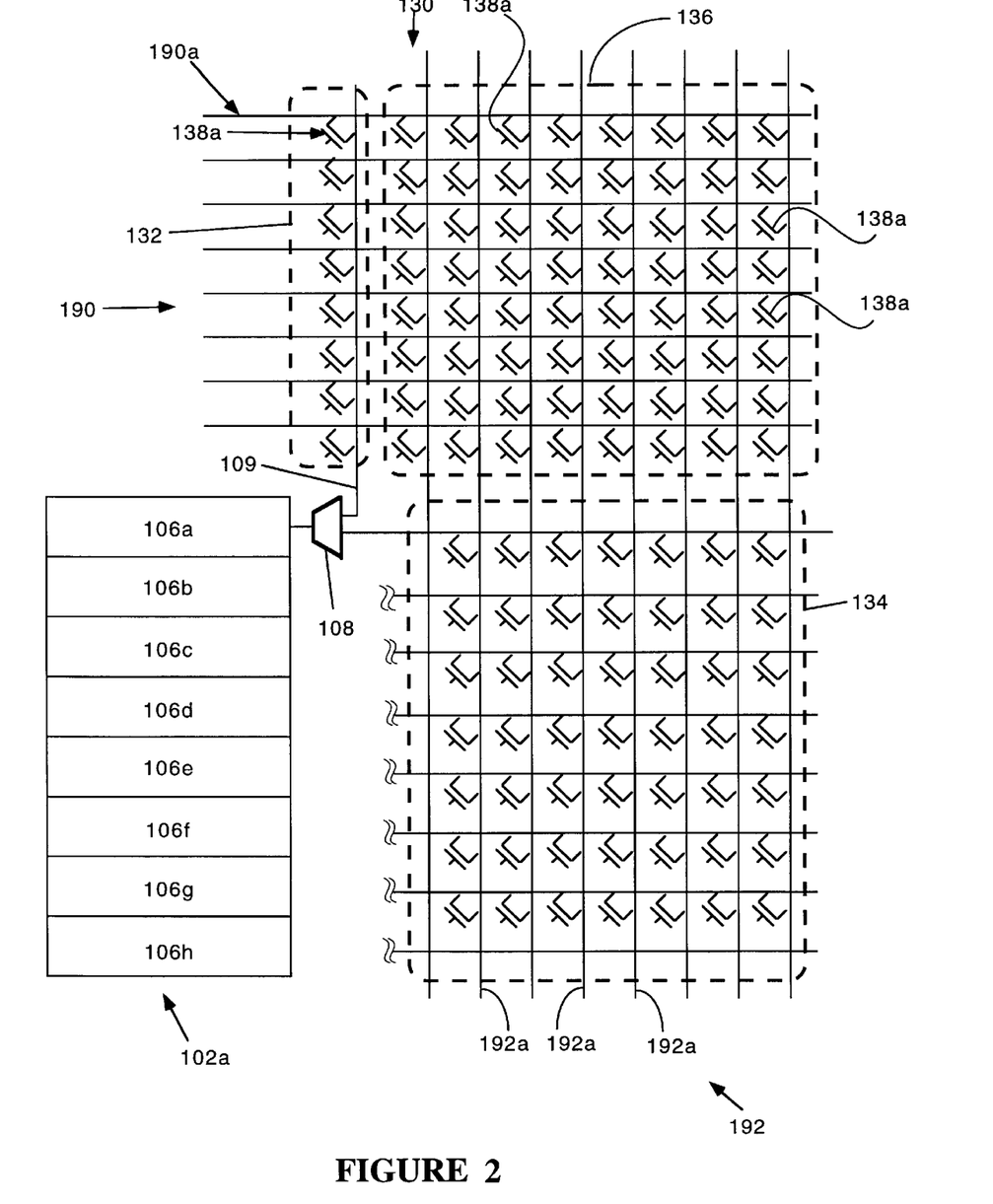
FIG. 2 is a schematic representation of a logic array block including its constituent logic elements coupled to a horizontal and a vertical conductor by way of associated programmable connectors.

Programmable logic encompasses all digital logic circuits that are configured by the end user, including PLDs, field programmable gate arrays (FPGAs) and complex programmable logic devices (CPLDs). Referring initially to FIGS. 1 and 2, a CPLD with an embedded array programmable logic design will be described. Although only a few logic array blocks or memory blocks are illustrated, it should be appreciated that any number may be provided in order to meet the needs of a particular system.

The general architecture of the embedded array programmable logic design will be generally familiar to those knowledgeable of the FLEX10K™ logic family of devices manufactured by the Altera Corporation of San Jose, Calif. Such an architecture, for example, is also described in U.S. Pat. No. 5,550,782 and *Altera* Data Book 1996, both of which are incorporated herein by reference.

Referring initially to FIG. 1, a CPLD 100 includes a core region 120 coupled to a plurality of bi-directional ports 160 included within a peripheral region 121. Peripheral region 121 also includes a peripheral bus 150 coupled to each of the plurality of ports 160 by way of an associated peripheral bus interface 170. A bi-directional data bus 172 couples each port 160 to a plurality of conductors 190 by way of an associated data multiplexer 110. The data bus 172 is arranged to pass data between each associated one of the plurality of ports 160 and selected row or column channels respectively included (but not shown) in each of the plurality of conductors 190. Unfortunately, the peripheral bus 150 is designed to only carry a variety of control and clock signals (e.g. output enable (OE), data latch clear (CL), and system clock (CLK)) between each of the plurality of ports 160 and is therefore not capable of carrying any data signals. As a consequence, data may only pass between the ports 160 and the plurality of conductors 190 by way of its associated data bus 172.

By way of example, bi-directional port 160 is coupled to peripheral bus 150 by way of peripheral bus interface 170 that includes a plurality of control and clock signals connectors. Bi-directional port 160 is also selectively coupled to a horizontal conductor 190 (and all row channels included therein) by way of a data multiplexer 110 so that core region 120 may communicate with external circuitry connected to bi-directional port 160. Such external circuitry may, for example, include systems such as Pentium™ based PCs or Sun SPARCstations™. Such systems being capable of executing automatic place and route software such as, for example, MAX+PLUS II™ developed by the Altera Corporation of San Jose, Calif. In a procedure known in the art as fitting a logic function, such automatic place and route software is used to logically couple previously programmed logic and memory units included within core region 120. In this manner, CPLD 100 is programmed to perform the logic function as desired.

Fitting a logic function requires the place and route software to first logically couple a selected set of previously programmed logic array blocks (LABs) and embedded array blocks (EABs) located in core region 120. Each EAB includes an array of memory cells. Each LAB includes a plurality of logic elements (LE) each of which are capable of performing simple logic functions. A logic interconnect included within each LAB serves to interconnect each of the logic elements included therein. As shown in FIG. 1, core region 120 includes a plurality of LABs 102 and a plurality of EABs 104 programmably interconnected by way of plurality conductors 180 to form a logic and memory array. By way of example, LABs 102a, 102b and EAB 104a are coupled by way of conductor 190 such that port 160 may selectively access LAB 102a, LAB 102b or EAB 104a by way of data multiplexer 110.

In some instances, fitting a logic function may require a bi-directional port to access logic or memory blocks coupled with conductors associated with other bi-directional ports. Unfortunately, since conventionally each bi-directional port can only access its associated conductor, it is often necessary to cross couple selected ones of the conductors (including the associated plurality of row channels and column channels therein). In order to accomplish this cross coupling of conductors, a programmable routing mux (PRM) 136 is used. The PRM 136 that includes a plurality of programmable connectors each capable of selectively coupling a selected row channel and a selected column channel included in each of the cross coupled conductors. In this manner, a port may access logic array blocks (and logic elements therein) and/or memory blocks associated with another port. Unfortunately, the programmable connectors used are often limited in number and may prove insufficient to meet the needs of particular logic fitting routine.

The interconnections of PRM 136, logic array block 102a and its associated plurality of logic elements 106a–106h, horizontal conductor 190 and its associated plurality of row channels 190a, and vertical conductor 192 and its associated plurality of column channels 192a are illustrated in FIG. 2. PRM 136 includes an array of programmable connectors 138 capable of selectably coupling any of the plurality of row channels 190a and any of the plurality of column channels 192a. A programmable connector 138a is represented as a single programmable bit, however, it should be noted that any suitable programmable connector type device may be used.

In order to fit the desired logic function, various logic elements may be individually configured to perform a small but crucial part of the overall logic function. Any automatic routing and placing software must then logically connect all the programmed logic elements (and in some cases, memory included in the various EABs) such that CPLD 100 may execute the desired logic function. By way of example, in order for logic element 106a to be accessed by row channel 190a such that port 160 may access logic element 106a, multiplexer 108 may selectively enable data line 109. Enable data line 109 is then programmably coupled to row channel 190a by way of programmable connectors 132a within programmable connection 132 such that port 160 may access logical element 106a. Programmable connector 132a would then not be available for other connections until released. Unfortunately, even if port 160 is able to connect to desired logic elements in logic array block 102a, the path may be so circuitous as to create a slow data path which may prove to be unacceptable for the application at hand.

Alternatively, if it is required that a port 162 couple to logic element 106a of the LAB 102a, programmable resources in addition to those discussed above would be required since it would be necessary to couple conductor 194, for example, to conductor 192 and then to conductor 190 to be able to utilize enable data line 109. As can be seen, the need to form circuitous links within core region 120 may use substantial numbers of programmable connectors 138a which may be of limited availability.

A very complex logic function may require more connections than the number of available programmable connectors is able to provide. In this case, the fitting is said to have failed. This problem is exacerbated by the fact that each bi-directional port in CPLD 100 may access only its associated conductor such that additional programmable connectors are consumed in order to access LABs or EABs associated with other conductors.

In view of the foregoing, it is advantageous and therefore desirable to have available a programmable logic device which is capable of coupling together adjacent bi-directional ports such that each may access each others associated conductor without using substantially any core region programmable connectors. In this manner, ports may access logic elements and memory blocks without using substantially any core region programmable connectors. By reducing the number of core region programmable connectors consumed in fitting a particular logic function, the complex programmable logic device will have a higher success rate in fitting logic functions.

SUMMARY OF THE INVENTION

The invention relates to a programmable logic device architecture incorporating a I/O overflow bus. The present invention provides an improved programmable logic architecture by incorporating an I/O overflow bus. The I/O overflow bus allows for greater flexibility in the routing of signals thereby increasing the probability of successfully fitting logic functions in the programmable logic device. Additionally, the I/O overflow bus allows for the implementation of particular logic functions in a peripheral region of the programmable logic device independent of the programmable logic device core region.

In a preferred embodiment of the invention, the programmable logic device has a core region that includes at least a plurality of logic cells interconnected by way of associated programmable logic cell conductors. The interconnected logic cells form an array suitable for use in implementing desired logic functions. The programmable logic device also has a peripheral region. The peripheral region includes at least a plurality of bi-directional ports of which selected ones may be coupled to external circuitry. The peripheral region also includes a bi-directional peripheral I/O overflow bus suitably arranged to pass a plurality of control signals and a plurality of data signals between the core region and the plurality of bi-directional ports.

In another aspect of the invention, a programmable logic device incorporating a conductor type I/O overflow bus formed from a vertical and a horizontal conductor is disclosed. The programmable logic device has a peripheral region that includes at least a plurality of horizontal and vertical bi-directional ports. In this embodiment, selected ones of each of the plurality of bi-directional ports may be coupled to external circuitry. The programmable logic device also has a core region that at least includes a plurality of logic cells interconnected by way of an associated plurality of programmable horizontal and vertical logic cell conductors. The interconnected logic cells form an array of logic cells suitable for use in implementing desired logic functions. The programmable logic device also includes a conductor-type I/O overflow bus formed from one of each of the plurality of vertical programmable cell conductors and the horizontal programmable cell conductors.

In yet another aspect of the invention, a programmable logic device architecture having both logic blocks and memory blocks that incorporates a peripheral I/O overflow bus is disclosed. The programmable logic device includes a core region and a peripheral region. The core region includes a plurality of logic blocks interconnected by way of associated programmable block connectors. The interconnected logic blocks form an array of logic blocks of which each includes an associated array of logic cells suitable for use in implementing desired logic functions. The core region further includes a memory block programmably coupled to the array of logic blocks by way of the programmable block connectors. The memory block includes an array of memory cells suitable for implementing desired memory functions.

The programmable logic device also includes a peripheral region. In this embodiment, the peripheral region includes a bi-directional peripheral I/O overflow bus suitably arranged to pass a plurality of control signals and a plurality of data signals between the core region and a plurality of bi-directional ports. The plurality of bi-directional ports is suitably disposed to pass control signals and data signals between the core region and external circuitry.

In still another aspect of the invention, a method of fitting a logic function in a programmable logic device having a core region which includes at least a plurality of logic cells interconnected by way of associated programmable logic cell conductors to form an array of logic cells wherein the array of logic cells are suitable for use in implementing desired logic functions. The programmable logic also includes a peripheral region having at least a plurality of bi-directional ports of which selected ones may be coupled to external circuitry and a bi-directional peripheral I/O overflow bus suitably arranged to pass a plurality of control signals and a plurality of data signals between the core region and the plurality of bi-directional ports. The method of the invention includes the following operations, first, the selected ones of the plurality of logic cells are programmed using the program signals so as to perform the associated subpart of the logic function to be fitted. Next, a first desired coupling path through the core region is determined such that each of the selected ones of the plurality of logic cells that have been programmed are coupled in such a way as to enable the programmable logic device to perform at least the subpart of the desired logic function. Finally, a second desired coupling path from the core region to the peripheral region is determined where the second desired coupling path interconnects with the first desired coupling path using the bi-directional peripheral I/O overflow bus so as to route data signals between the bi-directional ports and the core region.

In another aspect of the invention, a method of interconnecting bi-directional ports in a peripheral region of a programmable logic device wherein each bi-directional port has an associated peripheral I/O overflow bus interface unit and each bi-directional port contains at least a data latch unit is disclosed. The method of the invention includes the following operations. First, an external pad of a first selected one of the plurality of bi-directional ports is connected to an external circuit capable of generating a data signal. Next, the data signal is input to a first data latch associated with the first selected one of the plurality of bi-directional ports after which the data signal is stored in the first data latch in accordance with a first clock signal. The stored data is then output from the first data latch to a second data latch associated with a selected adjacent one of the plurality of bi-directional ports. The stored data signal is passed to the second data latch by way of a data path associated with both a first peripheral I/O overflow bus interface unit associated with the first selected one of the plurality of bi-directional ports and a second peripheral I/O overflow bus interface unit associated with the selected adjacent one of the plurality of bi-directional ports. Finally, the data signal received over the data path in accordance with a second clock signal is stored into the second data latch associated with the selected adjacent one of the plurality of bi-directional ports.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

DETAILED DESCRIPTION OF THE INVENTION

In the following description, numerous specific details are set forth in order to provide a thorough understanding of the present invention. It will be apparent, however, to one skilled in the art, that the present invention may be practiced without some or all of these specific details. In other instances, well known structures or operations have not been described in detail in order to not unnecessarily obscure the present invention.

In one embodiment, a complex programmable logic device architecture incorporates a peripheral I/O overflow bus. The peripheral I/O overflow bus couples each of a plurality of bi-directional ports included within a peripheral region of the CPLD. The bus is capable of passing both control and data signals between each of the bi-directional ports. The bus also enables two adjacent ports to access each other's associated conductors, associated core region logic, and/or memory blocks. In this manner, substantially increased flexibility in routing and placing results in greater success in fitting complex logic and/or logic/memory functions.

In another embodiment, an conductor type I/O overflow bus is formed from both the horizontal and vertical conductors associated with the four corners of the CPLD. The conductor type I/O overflow bus formed is capable of supplying horizontal data and control signals to associated horizontal ports and supplying vertical data and control signals to associated vertical ports.

Figure 3:
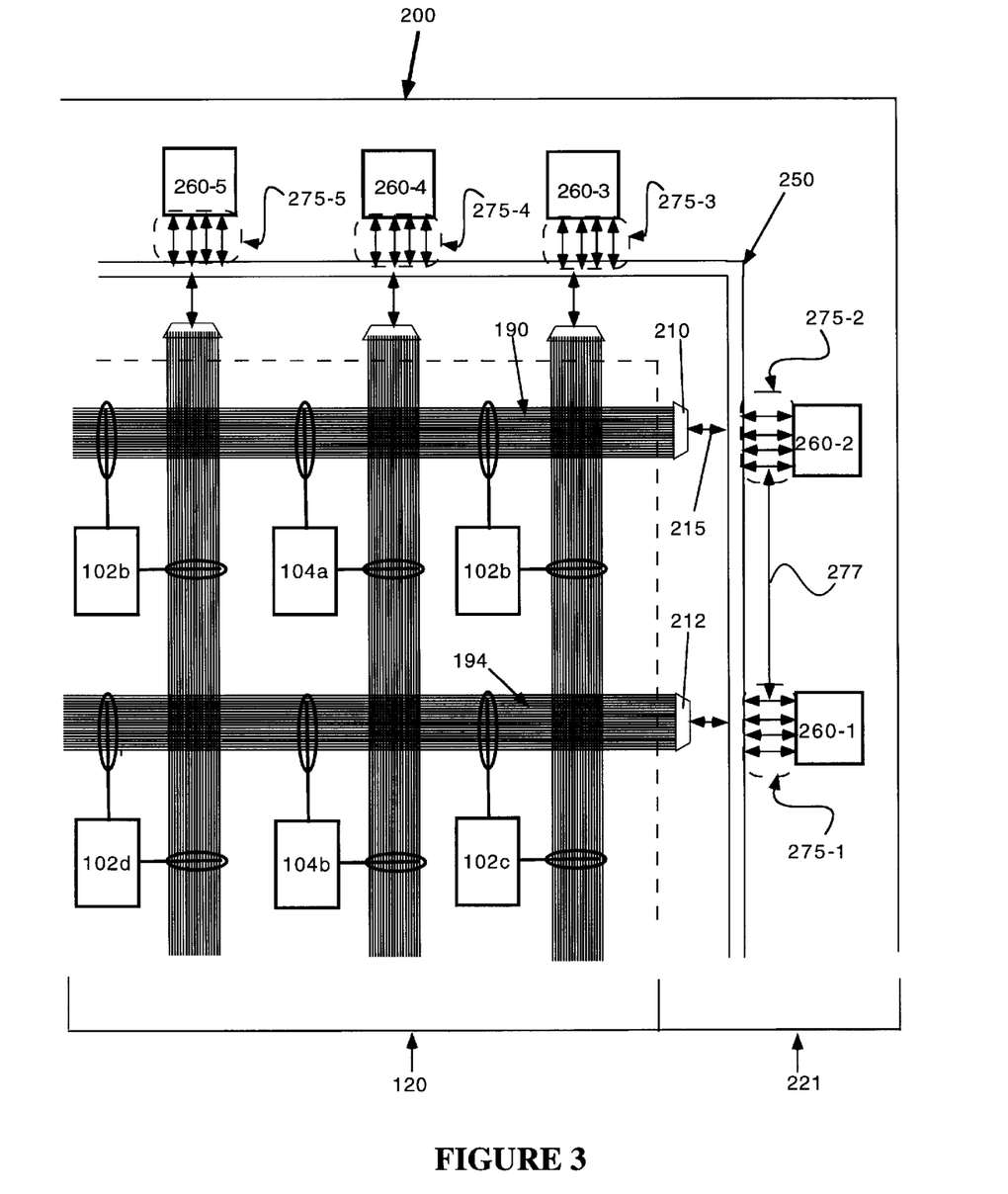
FIG. 3 is a functional block diagram of an embedded array type complex programmable logic device architecture having a plurality of vertical and horizontal bi-directional ports and incorporating a peripheral I/O overflow bus in accordance with a preferred embodiment of the invention.

A complex programmable logic device (CPLD) 200 having a peripheral I/O overflow bus 250 will now be described with reference to FIG. 3. The CPLD 200 has core region 120 coupled to a plurality of bi-directional ports 260 by way of a peripheral I/O overflow bus 250. The peripheral I/O overflow bus 250 is included in a peripheral region 221 of the CPLD 200. Ports 260 may be coupled to external circuitry such as computer systems (e.g., Pentium based PCs or Sun SPARCstations™) capable of executing automatic place and route software. One example of place and route software is the MAX+PLUS II™ developed by the Altera Corporation of San Jose, Calif. Peripheral I/O overflow bus interfaces 275 respectively couple bi-directional ports 260 to peripheral I/O overflow bus 250.

In the described embodiment, bi-directional port 260-2 is coupled to peripheral I/O overflow bus 250 by way of peripheral I/O overflow bus interface 275-2. Peripheral I/O overflow bus 250 is coupled to a data multiplexer 210 by way of a data bus 215. Data multiplexer 210 operates to selectably couple row channels included in conductor 190 to data bus 215. Using the conductor 190, bi-directional port 260-2 is able to be coupled to selected ones of the plurality of logic array blocks 102 and embedded array blocks 104 included in core region 120.

Additionally, adjacent ones of the bi-directional ports 260 can be coupled together by way of their respective peripheral I/O bus overflow bus interfaces 275. For example, as illustrated in FIG. 3 for ports 260-2 and 260-1, a data path 277 is formed between peripheral I/O overflow bus interfaces 275-1 and 275-2. The data path 277 couples peripheral I/O bus overflow bus interface 275-1 for bi-directional port 260-1 to peripheral I/O bus overflow bus interface 275-2 for adjacent bi-directional port 260-2. Although not shown, data paths are normally also provided between other adjacent pairs of ports 260 of the CPLD 200. As a result, each bi-directional port is able to access a conductor associated with its adjacent neighbor. By way of example, bi-directional port 260-2 may use data path 277 to access a horizontal conductor 194. In this manner, bi-directional port 260 may be coupled to one or more of logic block 102c, logic block 102d and as embedded array block 104b which are associated with conductor 194 as well as to any other logic and embedded array blocks that may be associated with conductor 190. Thus, data path 277 greatly improves the routability of data signals between the plurality of bi-directional ports 260 and the plurality of logic array blocks 102 and the plurality of embedded array blocks included in core region 120 because programmable connectors included in core region 120 need not be consumed when adjacent ports 260 desire to use conductors associated with their neighboring ports.

In order to fit a logic function, CPLD 200 may require selected ones of the plurality of logic array blocks 102 and embedded array blocks 104 to be configured to perform specific subparts of the desired logic function or to provide essential memory resources. After the selected logic array blocks and embedded array blocks have been appropriately configured, an external driver as described above uses automated placing and routing software to logically couple the programmed logic and embedded array blocks in core region 120 so as to fit the desired logic function. As described above, this may require logic and memory blocks in disparate locations of core region 120 to be electrically connected by way of a limited number of available programmable connectors in core region 120.

As an example, assume logic array block 102d has been appropriately configured to perform a small but essential subpart of the overall desired logic function. Further assume that in order to fit the desired logic function, bi-directional port 260-2 must access logic array block 102d in order to connect to selected logic elements (not shown) contained therein. Conventionally, bi-directional port 260-2 could only connect to logic array block 102d by using programmable connectors included in core region 120. However, if sufficient programmable connectors in the core region 120 are not available either in number or location to connect bi-directional port 260-2 to connect to the desired logic elements included in logic array block 102d then the fit of the logic function is said to have failed.

Fortunately, the improved architecture of the CPLD 200 substantially eliminates the fitting problems caused by the limited number of available programmable connectors in core region 120. By providing data paths at the peripheral region 221 of the CPLD 200, the fitting of logic functions is more probable because the need for programmable connectors in core region 120 is relaxed. As described above, the data paths allow adjacent ones of the plurality of bi-directional ports 260 to access each other's associated conductor. By way of example, assume logic array block 102d has been appropriately configured to perform a small but essential subpart of the overall desired logic function. Further assume that in order to fit the desired logic function, bi-directional port 260 must access logic array block 102d in order to connect to selected logic elements (not shown) contained therein. In the described embodiment, CPLD 200 is able to fit the desired logic function without using substantially any programmable connectors included in core region 120. Bi-directional port 260-2 can then access logic array block 102d and any logic elements contained therein simply by coupling to data path 277, through peripheral I/O bus overflow bus interface 275-1, and then to multiplexer 212 associated with conductor 194. Multiplexer 212 is then able to selectably couple the necessary row channels included within conductor 194 to logic array block 102d and associated logic elements included therein.

Figure 4:
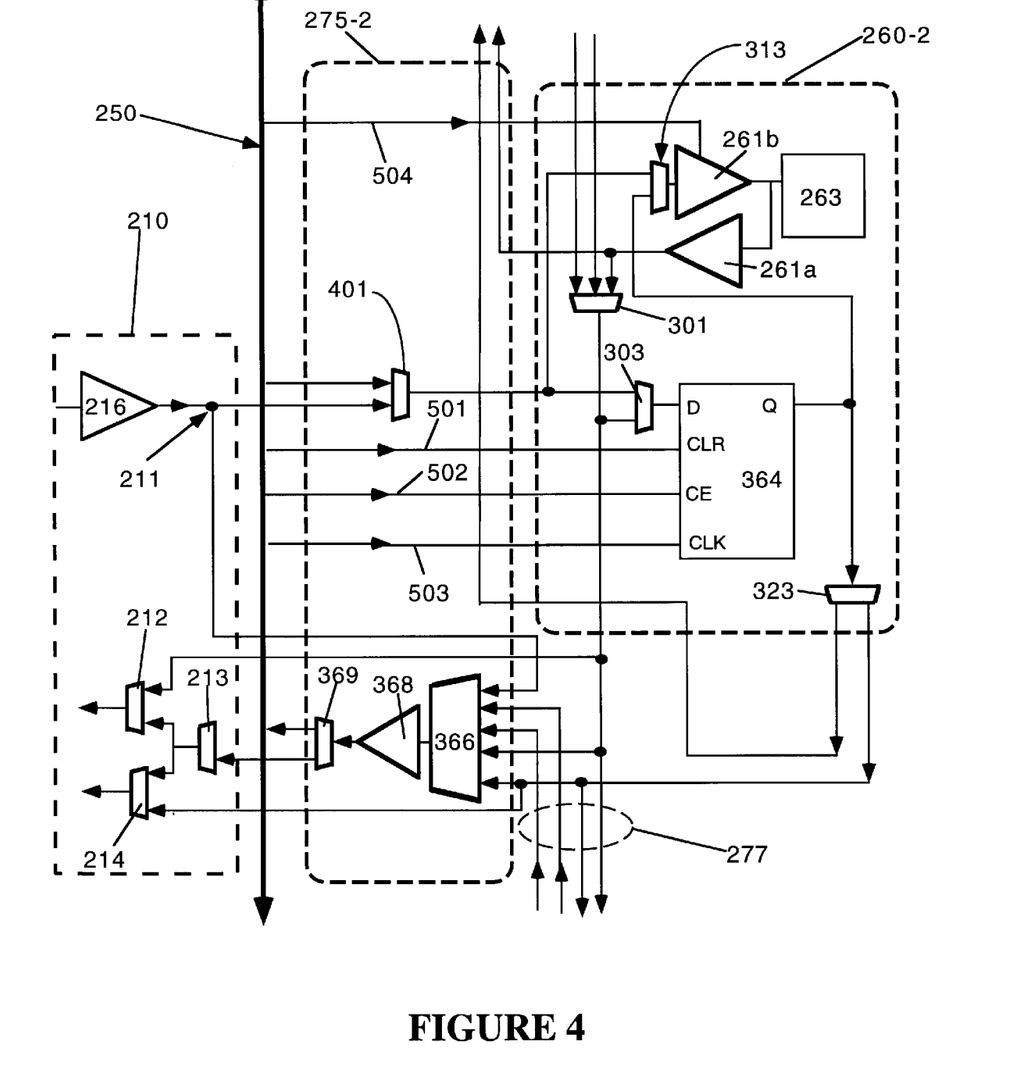
FIG. 4 is a circuit diagram of one of the plurality of horizontal bi-directional port as described in FIG. 3 coupled to the I/O overflow bus by way of its associated I/0 overflow bus interface.

FIG. 4 is a detailed block diagram illustrating constituent elements and interconnections of bi-directional port 260-2, peripheral I/O overflow bus interface 275-2, peripheral I/O overflow bus 250, and data multiplexer 210 of the CPLD 200 according to an embodiment of the invention. The elements and interconnections shown in FIG. 4 are representative of the elements and interconnections for other like portions of the CPLD 200.

Bi-directional port 260-2 includes an I/O pad 263 suitably disposed to electrically connect to external circuitry. Such external circuitry may, for example, be a computer system as described above. Pad 263 is also connected to an input buffer 261a and to an output buffer 261b. Input buffer 261a is suitably disposed to buffer signals received from pad 263 and output buffer 261b is suitably disposed to invert signals received from an output of an I/O multiplexer 313. Input buffer 261a has an output coupled to both a first input of a data multiplexer 301 and to a peripheral bus data multiplexer (not shown) included in a first adjacent bi-directional port (not shown). Data multiplexer 301 has two (2) additional data inputs both derived from the first adjacent bi-directional port and supplied over a data path multiplexer. Data multiplexer 301 has an output coupled to a first input of a data latch multiplexer 303 as well as a second adjacent bi-directional port (not shown) by way of data path 277. The output of data multiplexer 301 also forms a second input to a peripheral interface data multiplexer 366 in the peripheral I/0 overflow bus interface 275-2 as well as a first input to a first data multiplexer 212 in the data multiplexer 210.

In the described embodiment, data latch multiplexer 303 has a second input coupled to the output of an interface data multiplexer 401 within peripheral I/O overflow bus interface 275-2. The output of the data latch multiplexer 303 is supplied to a data latch 364 as data input D. Interface data multiplexer 401 is also coupled to a second input of I/O multiplexer 313. Data latch 364 has an output Q coupled to a first input of I/0 multiplexer 313 and to an input of a data output latch demultiplexer 323 of bi-directional port 260-2. Data output latch demultiplexer 323 has a first output coupled to the first adjacent bi-directional port and a second output forming a first input to peripheral interface data multiplexer 366 as well as an input to the second adjacent bi-directional port by way of data path 277.

Peripheral I/O overflow bus interface 275-2 includes interface data multiplexer 401 having a first input coupled to peripheral I/O overflow bus 250 and a second input coupled to core region 120 by way of data multiplexer 210. Peripheral 110 overflow bus interface 275-2 further includes peripheral interface data multiplexer 366 having a third input and a fourth input coupled to the second adjacent bi-directional port by way of datapath 277 as well as a fifth input coupled to core region 120 by way of data multiplexer 210 at node 211. An output of peripheral interface data multiplexer 366 is coupled to a buffer 368 having an output forming an input to a peripheral multiplexer 369. Peripheral multiplexer 369 has a first output coupled to peripheral I/O overflow bus 250 and a second output coupled to a second data demultiplexer 213 in the data multiplexer 210.

Peripheral I/O bus 250 is coupled to a CLR node input of data latch 364 by way of a clear (CLR) control signal connector 501. When activated, the clear control signal connector 501 causes data latch 364 to clear any stored data. Peripheral I/O overflow bus 250 also supplies a chip enable (CE) signal to a CE node input of data latch 366 by way of chip enable (CE) signal connector 502 at a CE node input. A system clock may be coupled to a CLK input node of data latch 364 by way of peripheral I/O overflow bus 250 and a clock connector 503. With data latch 366 in a synchronous mode, data latch 364 stores data in accordance with the system clock. Peripheral I/O overflow bus 250 may also be coupled to buffer 261*b* by an output enable (OE) connector 504 capable of passing an OE signal suitable for enabling port 260-2 to pass data between core region 120 and external circuitry.

In order to selectably couple selected conductors (e.g., conductor 190) and their associated channels to bi-directional port 260-2, data multiplexer 210 includes second data demultiplexer 213 having its input defined by the output of peripheral multiplexer 369 as described above. An output of second data demultiplexer 213 forms a second input to both first and third data multiplexers 212 and 214. Selected conductors and associated channels may be driven by an output of either first data multiplexer 212 or third data multiplexer 214.

Using the example discussed above regarding fitting a logic function in CPLD 200, a detailed description of the interactions of bi-directional port 260-2, peripheral I/O overflow bus interface 275-2, and data multiplexer 210 will be described with reference to FIG. 4. Assume for the sake of this discussion, external circuitry is connected to pad 263 which is enabled to pass data between core region 120 and the external circuitry by OE signal carried by OE connector 504. The external circuitry will send controlling signals to CPLD 200 by way of pad 263 for the purpose of fitting the desired logic function. Once enabled, pad 263 will pass data signals input from the external circuitry to multiplexer 301 by way of buffer 261*a*. When appropriately programmed, multiplexer 301 will send the data signals to data latch input multiplexer 303 as well as to the second adjacent bi-directional port and peripheral multiplexer 366. When CE signal is carried by CE connector 502 to CE input node such that data latch 364 is capable of receiving data, data latch 364 may operate in a synchronous or an asynchronous mode. When operable in synchronous mode, then the data signal will be stored in data latch 364 until such time as an appropriate CLK signal is passed to data latch 364 by way of connector 504. At that point, the data signal will be output from data latch output node Q substantially simultaneously to both the second input of I/O multiplexer 313 and the input of data output latch demultiplexer 323.

Data output latch demultiplexer 323 will be programmed according to whether it is desired to send the data signal to the conductor associated with data multiplexer 210 and the second adjacent bi-directional port or instead only to the first adjacent bi-directional port. If it is determined that the data signal is to be sent to the conductor associated with data multiplexer 210 and the second adjacent bi-directional port, then the data signal will be sent to peripheral multiplexer 366 and the data path 277. Peripheral multiplexer 366 will be programmed to select one of its input signals to be forwarded to conductor associated with data multiplexer 210. The selected data signal will be input to peripheral multiplexer 369 by way of buffer 368 which will either drive the data signal to peripheral I/O overflow bus 250 or to second data demultiplexer 213. If driven to second data demultiplexer 213 within data multiplexer 210, then first and third data multiplexers 212 and 214 will be programmed to send the selected data signal to a selected channel included in the associated conductor.

Alternatively, data is passed from core region 120 to pad 263 by way of data multiplexer 210. As shown, input data from core region 120 is initially inverted by way of a core data inverter 216. The resulting inverted data is then passed to interface data multiplexer 401 which is programmed to selectively pass the data to I/O multiplexer 313 which in turn inputs the data to inverter 261*b*. The data signal is inverted again by the inverter 261*b* to true data and output to pad 263.

Several advantages to using the peripheral I/O overflow bus stem from the increased routability due to the ability of a port to readily access conductors associated with adjacent ports without using core region programmable connectors. One advantage is that the use of peripheral I/O overflow bus greatly improves the probability of success in fitting complex logic functions. Another advantage is that the risk of fitting a logic function with unacceptable performance problems caused by circuitous routing is substantially reduced.

Figure 5:
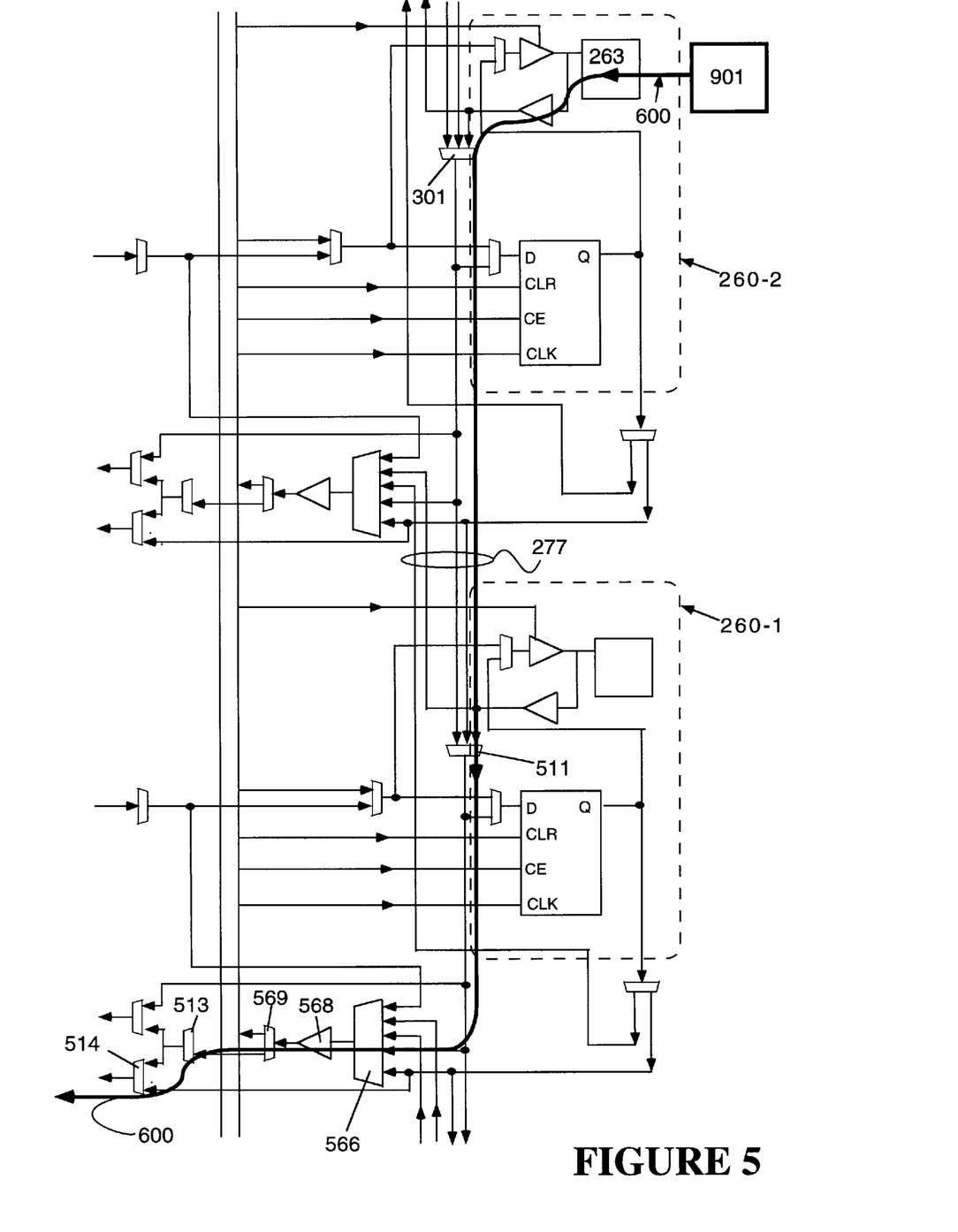
FIG. 5 is a circuit diagram of two adjacent ones of the plurality of bi-directional horizontal ports as shown in FIG. 4 coupled by way of the I/O overflow bus interface such that each bi-directional port may access horizontal conductors associated with the other.

FIG. 5 is a circuit diagram of two adjacent bi-directional ports 260-1 and 260-2 having a construction such as shown in FIG. 4. The bi-directional ports 260-1 and 260-2 are coupled by way of the data path 277 such that each bi-directional port may access horizontal conductors associated with the other. For example, bi-directional port 260-2 can access conductors 194 associated with bi-directional port 260-1, and bi-directional port 260-1 can access conductors 190 associated with bi-directional port 260-2. FIG. 5 illustrates a specific example where bi-directional port 260-2 communicates with conductor 194 associated with bi-directional port 260-1 by way of a data path 600. It should be noted that data path 600 is one of many possible links (data routes) between adjacent bi-directional ports 260-1 and 260-2 wherein each may communicate the other's associated conductors (and thus to the logic and embedded array blocks coupled thereon). The data path 600 linking I/O pad 263 to conductor 194 associated with bi-directional port 260-1 may be used by a data signal 700 originating in external circuitry 901 to drive conductor 194 associated with bi-directional port 260-1. Following the data path 600, a true data signal 700 drives I/O pad 263 and is input to inverter 261*a* which inverts true data signal 700 to form an inverted data signal 701. The inverted data signal 701 is then selected by multiplexer 301 and to drive an input to a peripheral multiplexer 566. Peripheral multiplexer 566 then selects inverted data signal 701 and passes it to an inverter 568 which inverts the inverted data signal 701 to again form true data signal 700. True data signal 700 is then selected by a multiplexer 569 to pass to a multiplexer 513. Multiplexer 513 then selects true data signal 700 to pass to a multiplexer 514 which selects true data signal 700 to pass to conductor 194. It should be noted that there are various other routes by which data can be passed between core region 120 and the plurality of bi-directional ports 260.

Figure 6:
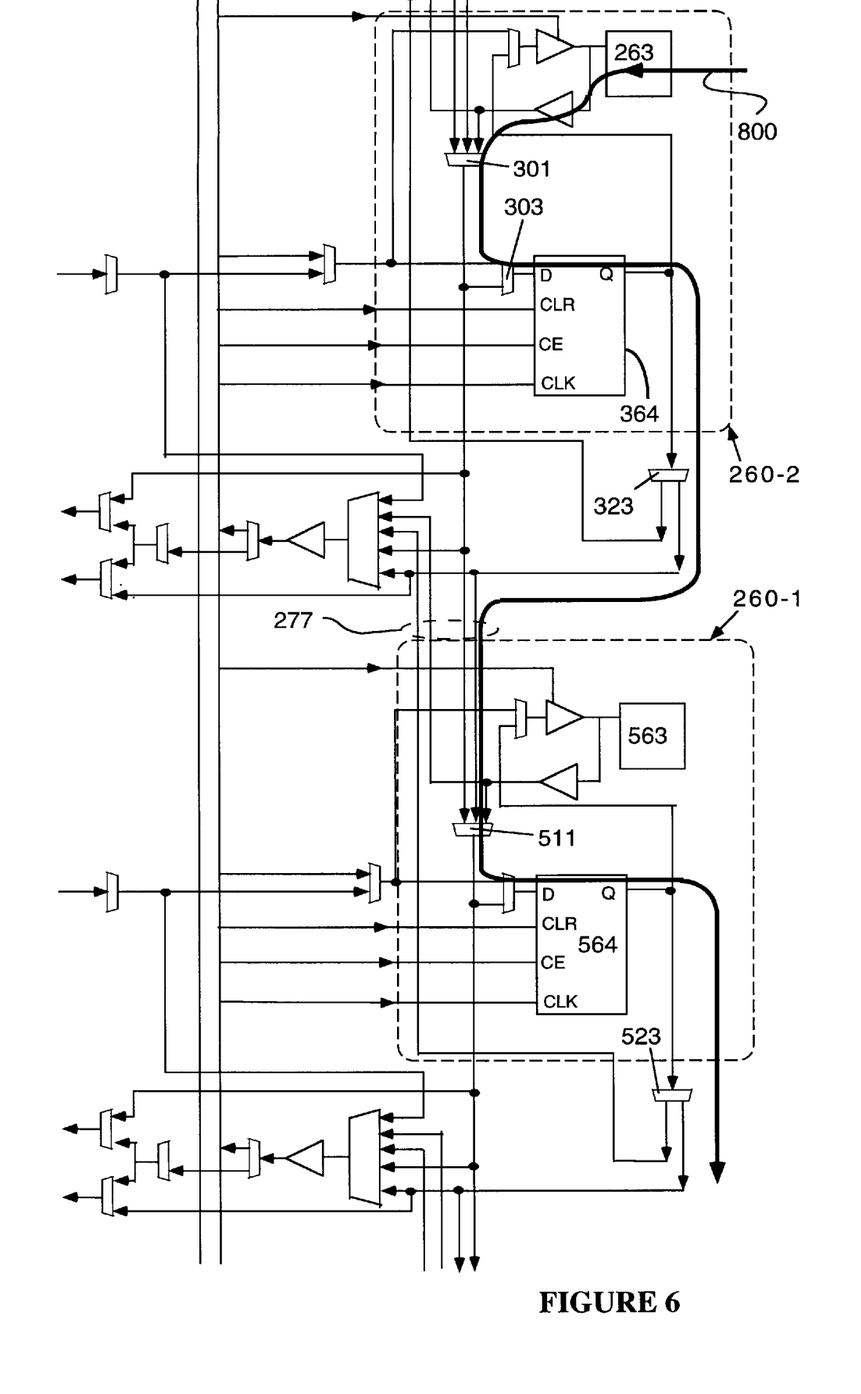
FIG. 6 is a circuit diagram of two adjacent ones of the plurality of bi-directional horizontal ports as shown in FIG. 4 coupled by way of the I/O overflow bus interface such that a logic function may be implemented without using core region programmable connectors.

FIG. 6 illustrates an additional use for peripheral I/O overflow bus 250 and associated peripheral I/O overflow bus interface 275 to form logic functions without using core region programmable connectors. More particularly, FIG. 6 illustrates a shift register implementation. A data signal 800 is input to pad 263 which then drives to multiplexer 301 which passes the data signal 800 to an input of multiplexer 303. After data latch 364 is selected to operate in a synchronous mode, the data signal 800 is stored in data latch 364 in accordance with a clock signal until a subsequent clock signal determines that the stored data is to be output to demultiplexer 323. Demultiplexer 323 selects data signal 800 to drive the input of a multiplexer 511 included in bi-directional port 260-1. As with data latch 364, a data latch 564 is selected to operate in a synchronous mode so as to store data signal 800 until such time as the stored data is to be output to a multiplexer 523. This procedure is repeated as many times as is necessary until the last cycle where data signal 800 is finally output to the external circuitry. In this manner, a shift register has been created without using any core region programmable connectors. It should be noted that this example was chosen simply to demonstrate the ease of implementing additional logic functions exclusive of core region 120. Other combinations are entirely possible, including those which supplement logic functions already implemented by core region 120.

Figure 7:
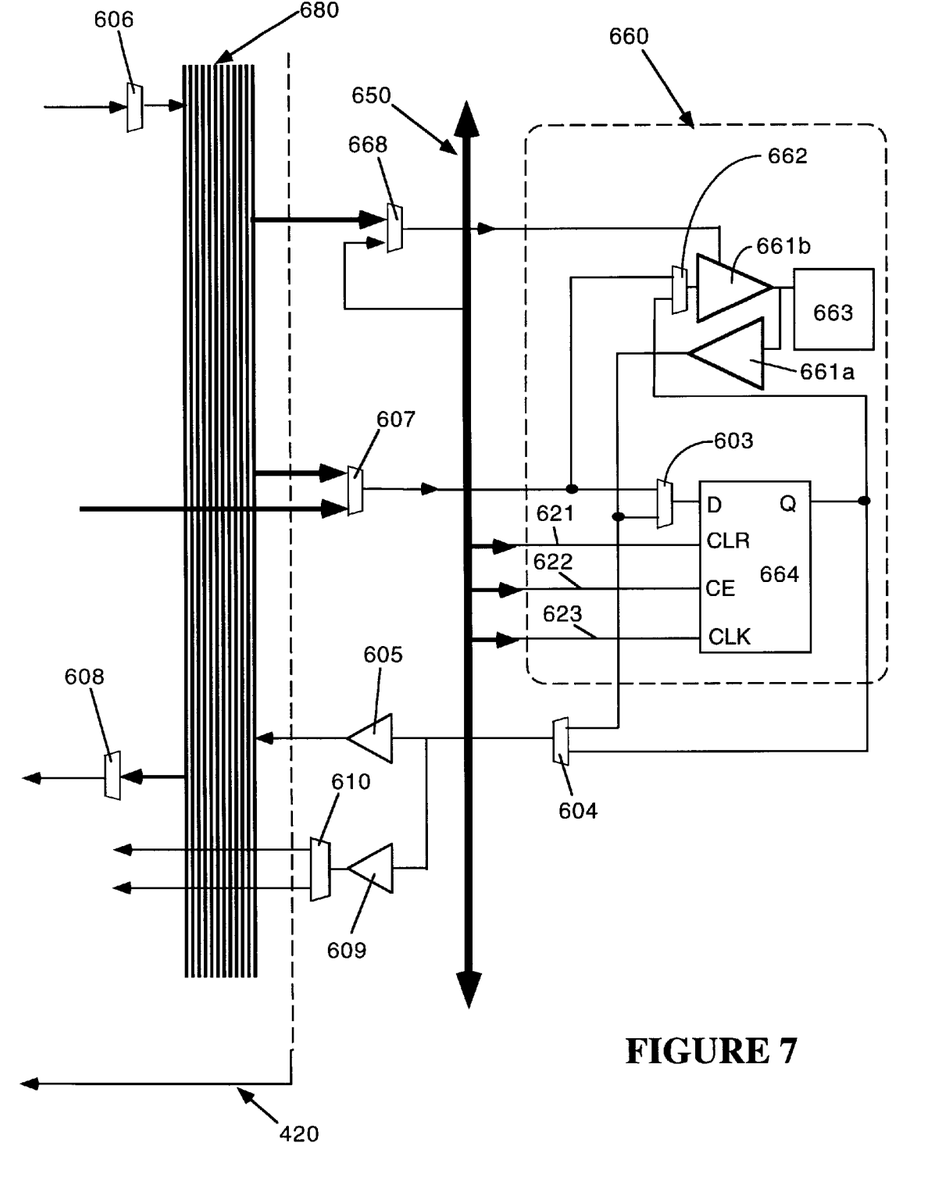
FIG. 7 is a functional block diagram of a conductor type I/O overflow bus using the vertical and horizontal conductors associated with the four corners of the embedded array logic type complex programmable logic device architecture in accordance with another embodiment of the invention.

In another embodiment of the invention, when the peripheral region can not support a peripheral-type I/O overflow bus the conductors located in the four corners of the core region can be used as a conductor-type I/O overflow bus. By way of example, FIG. 7 shows just such an arrangement where a vertical conductor 680 is used to form the conductor-type I/O overflow bus coupled to a bi-directional port 660. In the described arrangement, bi-directional port 660 includes an I/O pad 663 suitably disposed to electrically connect to external circuitry such as described above. Pad 663 is also connected to an input of buffer 661a and to an outputbuffer 661b. Buffer 661a is suitably disposed to drive signals received from pad 663 and has an output coupled to a first input of data latch input multiplexer 603 and a first input to a data multiplexer 604.

A data multiplexer 607 has a first input coupled to vertical conductor 680 and a second input coupled to a core region 420 by way of a data multiplexer (not shown). Data multiplexer 607 has an output coupled to a first input of I/O multiplexer 662 and a second input of data latch input multiplexer 603 multiplexer having an output coupled to a data input D of data latch 664. Data latch 664 has an output Q coupled to a second input of I/O multiplexer 662 and a second input to a second data multiplexer 604. In the described embodiment, peripheral bus 650 is coupled to data latch 664 by way of a clear (CLR) control signal connector 621 at a CLR node. Peripheral bus 650 is also capable of passing a chip enable (CE) signal capable of enabling data latch 664 by way of chip enable (CE) signal connector 622 at a CE node input. A system clock may be coupled to data latch 664 by way of conductor-type I/O overflow bus 650 through a clock connector 623 at a CLK node input Conductor-type I/O overflow bus 650 may also be coupled to buffer 661b by way of OE multiplexer 668 such that conductor-type I/O overflow bus 650 may supply an OE signal to a first input of OE multiplexer 668. Conductor 680 may supply an OE signal to a second input of OE multiplexer 668 wherein an output is capable of passing an OE signal suitable for enabling port 663 to pass data between core region 420 and connected external circuitry.

In the described embodiment, an output of first data multiplexer 604 forms an input to an inverter 605 having its output coupled to conductor 680. The output from multiplexer 604 also provides an input to a second inverter 609 having an output coupled to a demultiplexer 610. Demultiplexer 610 has its outputs coupled to associated horizontal conductors included in core region 620 such that data may pass between pad 663 and horizontal conductors (and associated row channels). Vertical conductor 680 may be coupled to core region 420 by way of a data multiplexer 608 such that data may pass from vertical conductor 680 to core region 420. Vertical conductor 680 may also be coupled to core region 420 by way of data multiplexer 606 suitable for passing data from core region 420 to conductor 680.

Alternatively, the conductor-type I/O overflow bus formed from a horizontal conductor may be used to pass data from core region 420 to associated vertical ports.

The invention has numerous advantages. One advantage of the invention is that by a CPLD with a peripheral I/O overflow bus that allows adjacent ports to communicate with each other's associated conductors, core region routing resources need not be consumed to route signals between adjacent ports. As a result, the CPLD according to the invention has substantially improved internal routability. Another advantage of the invention is that logic functions or portions of logic functions may be formed in a peripheral area of the CPLD using the peripheral I/O overflow bus to selectively pass signals between each adjacent bi-directional ports. These logic functions implemented in the peripheral area may operate separate from or in conjunction with the core region and logic functions configured therein. Consequently, the increased flexibility enables the CPLD to fit more complex logic functions more often than possible with conventional CPLD architectures.

Although the foregoing invention has been described in some detail for purposes of clarity of understanding, it will be apparent that certain changes and modifications may be practiced within the scope of the appended claims. It should be noted that there are may alternative ways of implementing the present invention. It is therefore intended that the following appended claims be interpreted as including all such alterations, permutations, and equivalents as fall within the spirit and scope of the present invention.

What is claimed is:

1. A programmable logic device comprising:
   a core region including at least:
      a plurality of logic cells interconnected by way of associated programmable logic cell conductors to form an array of logic cells, the array of logic cells being suitable for use in implementing desired logic functions; and
   a peripheral region including at least:
      a plurality of bi-directional ports of which selected ones may be coupled to external circuitry; and
      a bi-directional peripheral I/O overflow bus arranged to pass a plurality of control signals and a plurality of data signals between the core region and the plurality of bi-directional ports.

2. A programmable logic device as recited in claim 1 wherein each of the plurality of bi-directional ports has an associated peripheral I/O overflow interface unit, the peripheral I/O overflow interface unit being disposed to electrically couple the plurality of bi-directional ports to the peripheral I/O overflow bus.

3. A programmable logic device as recited in claim 2 wherein the peripheral region further includes a plurality of peripheral bi-directional data paths, each of the data paths being connected between adjacent ones of the plurality of bi-directional ports.

4. A programmable logic device as recited in claim 3 wherein the peripheral bi-directional data paths are capable of passing data between associated adjacent ones of the plurality of bi-directional ports in such a manner as to enable implementation of particular logic functions in the peripheral region separate from logic functions implemented in the core region.

5. A programmable logic device as recited in claim 4, wherein the peripheral I/O overflow interface unit is coupled to one of the peripheral bi-directional data paths such that data may be passed between the associated one of the bi-directional ports and a conductor associated with an adjacent one of the plurality of bi-directional ports.

6. A programmable logic device as recited in claim 2 wherein each of the plurality of bi-directional ports includes:
- a data latch unit, the data latch unit suitably arranged to selectably operate in a first mode and a second mode; and
- an I/O unit having an external pad suitable for connecting to external circuitry, the external pad being coupled to a data latch input node of the data latch unit, the associated peripheral I/O overflow bus interface unit, and the adjacent one of the plurality of bi-directional ports.

7. A programmable logic device as recited in claim 6 wherein the I/O unit operates to pass selected ones of a plurality of data signals between,
- the external pad and the data latch unit,
- the external pad and the peripheral bus interface unit, and
- the external pad and the adjacent one of the plurality of bi-directional ports.

8. A programmable logic device as recited in claim 6 wherein the first mode is a synchronous mode and the second mode is an asynchronous mode such that in the synchronous mode the data latch may store data received at the data latch input node at an appropriate clock signal.

9. A programmable logic device as recited in claim 6 wherein the peripheral I/O overflow bus interface unit comprises:
- a clock line, the clock line connected to and forming an input to the data latch unit at a data latch clock input node, the clock line being arranged to carry a clock signal from a clock to the data latch clock input node when the data latch block unit operates in the synchronous mode;
- a chip enable line, the chip enable line connected to and forming an input to the data latch unit at a data latch unit chip enable node, the chip enable line being arranged to carry a chip enable signal from a chip enable signal generator to the data latch unit chip enable node whereby the chip enable signal actuates the data latch unit;
- a clear signal line, the clear signal line connected to and forming an input to the data latch unit at a clear signal input node, the clear signal line being arranged to carry a data latch clear signal from a data latch clear signal generator to the data latch unit whereby any data stored within the data latch is cleared;
- an output enable line, the output enable line connected to and forming an input to the I/O pad unit and being arranged to carry an output enable signal from an output enable signal generator to the I/O block unit such that in an enabled mode the I/O unit may be operable to communicate with external circuitry and in a disabled mode the I/O unit may be incapable of communicating with external circuitry;
- a core data out line coupled to the data input node of the data latch unit and the I/O pad unit; and
- a peripheral data multiplexer having a plurality of data inputs and an output coupled to selected ones of the plurality on conductors included within the core region.

10. A programmable logic device as recited in claim 9 wherein the plurality of data inputs further includes:
- a first input coupled to the core data out line;
- a second input coupled to the data latch output node;
- a third input coupled to the I/O pad;
- a fourth input coupled to an adjacent bi-directional port; and
- a fifth input coupled to an I/O node associated with the adjacent bi-directional port.

11. A programmable logic device as recited in claim 1 wherein the peripheral I/O overflow bus may be used to implement a multiplicity of logic functions by interconnecting selected ones of the plurality of bi-directional ports without substantially using any programmable connectors associated with the core region.

12. A programmable logic device as recited in claim 1 wherein certain of the logic cells in the core region that are associated with one of the programmable logic cell conductors which is in turn associated with a selected one of the plurality of bi-directional ports can be coupled to another one of the plurality of bi-directional ports by data path without substantially using the programmable logic cell connectors of the core region.

13. A programmable logic device comprising:
- a peripheral region including at least:
  - a plurality of horizontal and vertical bi-directional ports of which selected ones may be coupled to external circuitry; and
- a core region including at least:
  - a plurality of logic cells interconnected by way of an associated plurality of programmable horizontal logic cell conductors and an associated plurality of vertical logic cell conductors to form an array of logic cells, the array of logic cells being suitable for use in implementing desired logic functions; and
  - a conductor type I/O overflow bus, the over flow bus formed from at least one of the plurality of vertical programmable cell conductors, the overflow bus being coupled to the plurality of horizontal bi-directional ports, the I/O overflow bus being arranged to pass selected ones of a plurality of control signals and selected ones of a plurality of data signals between the core region and selected ones of the plurality of horizontal bi-directional ports.

14. A programmable logic device as recited in claim 13 wherein each of the plurality of bi-directional ports includes:
- a data latch unit, the data latch unit suitably arranged to selectably operate in a first mode and a second mode; and
- an I/O unit having an external pad suitable for connecting to external circuitry, the external pad being coupled to a data latch input node of the data latch unit.

15. A programmable logic device as recited in claim 13 wherein the I/O unit operates to pass selected ones of a plurality of data signals between the external pad and the data latch unit.

16. A programmable logic device comprising:
- a core region including at least:
  - a plurality of logic blocks interconnected by way of associated programmable block connectors to form an array of logic blocks, the array of logic blocks each including an associated array of logic cells and being suitable for use in implementing desired logic functions; and
  - a memory block programmably coupled to the array of logic blocks by way of the programmable block connectors, the memory block including an array of memory cells, the memory block being suitable for implementing desired memory functions; and a peripheral region including at least:
- a bi-directional peripheral I/O overflow bus suitably arranged to pass a plurality of control signals and a plurality of data signals between the core region and a plurality of bi-directional ports, the plurality of bi-directional ports suitably disposed to pass control signals and data between the core region and external circuitry.

17. A programmable logic device as recited in claim 16, wherein adjacent ones of the plurality of bi-directional ports are coupled by way of a bi-directional data connector, the bi-directional data connector being capable of passing data between associated adjacent bi-directional ports in such a manner as to enable the implementation of particular logic functions in the peripheral region separate from logic functions implemented in the core region.

18. A programmable logic device as recited in claim 16 wherein each of the plurality of bi-directional ports has an associated peripheral I/O overflow interface unit, the interface unit being disposed to electrically couple the plurality of bi-directional ports to the peripheral I/O overflow bus.

19. A programmable logic device as recited in claim 16 wherein each of the plurality of bi-directional ports includes:
- a data latch unit, the data latch unit suitably arranged to selectably operate in a first mode and a second mode; and
- an I/O unit having an external pad suitable for connecting to external circuitry, the external pad being coupled to a data latch input node of the data latch unit, the associated peripheral I/O overflow bus interface unit, and an adjacent one of the plurality of bi-directional ports.

20. A programmable logic device as recited in claim 19 wherein the I/O unit operates to pass selected ones of a plurality of data signals between,
- the external pad and the data latch unit,
- the external pad and the peripheral bus interface unit, and
- the external pad and the adjacent one of the plurality of bi-directional ports.

21. A method of fitting a logic function in a programmable logic device having a core region which includes at least a plurality of logic cells interconnected by way of associated programmable logic cell conductors to form an array of logic cells wherein the array of logic cells are suitable for use in implementing desired logic functions, a peripheral region which includes at least a plurality of bi-directional ports of which selected ones may be coupled to external circuitry and a bi-directional peripheral I/O overflow bus suitably arranged to pass a plurality of control signals and a plurality of data signals between the core region and the plurality of bi-directional ports, said method comprising:

connecting at least one of the plurality of bi-directional ports to an external circuit, the external circuit being capable of generating program signals capable of causing selected ones of the plurality of logic cells to be programmed to perform at least a subpart of the desired logic function to be fitted;

programming the selected ones of the plurality of logic cells using the program signals so as to perform the associated subpart of the logic function to be fitted;

determining a first desired coupling path through the core region such that each of the selected ones of the plurality of logic cells that have been programmed are coupled in such a way as to enable the programmable logic device to perform at least the subpart of the desired logic function; and determining a second desired coupling path from the core region to the peripheral region, the second desired coupling path interconnects with the first desired coupling path using the bi-directional peripheral I/O overflow bus so as to route data signals between the bi-directional ports and the core region.

22. A method of interconnecting bi-directional ports in a peripheral region of a programmable logic device wherein each bi-directional port has an associated peripheral I/O overflow bus interface unit and each bi-directional port contains at least a data latch unit, said method comprising:

connecting an external pad of a first selected one of the plurality of bi-directional ports to an external circuit, the external circuit being capable of generating a data signal;

inputting the data signal to a first data latch associated with the first selected one of the plurality of bi-directional ports;

storing the data signal in the first data latch in accordance with a first clock signal;

outputting the stored data signal from the first data latch to a second data latch associated with a selected adjacent one of the plurality of bi-directional ports by way of a data path, the data path being associated with both a first peripheral I/O overflow bus interface unit associated with the first selected one of the plurality of bi-directional ports and a second peripheral I/O overflow bus interface unit associated with the selected adjacent one of the plurality of bi-directional ports; and storing the data signal received over the data path in accordance with a second clock signal into the second data latch associated with the selected adjacent one of the plurality of bi-directional ports.

* * * * *